US010539982B2

(12) United States Patent
Lin et al.

(10) Patent No.: US 10,539,982 B2
(45) Date of Patent: Jan. 21, 2020

(54) HOUSING ASSEMBLY AND COVER APPLIED TO ELECTRONIC DEVICE

(71) Applicant: ASUSTEK COMPUTER INC., Taipei (TW)

(72) Inventors: Chih-Kuang Lin, Taipei (TW); Szu-Tang Chiu, Taipei (TW); Wai-Tong Chan, Taipei (TW); Sin-Fei Lai, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/031,479

(22) Filed: Jul. 10, 2018

(65) Prior Publication Data

US 2019/0018455 A1    Jan. 17, 2019

Related U.S. Application Data

(60) Provisional application No. 62/530,855, filed on Jul. 11, 2017.

(30) Foreign Application Priority Data

May 25, 2018  (CN) .......................... 2018 1 0518535

(51) Int. Cl.
*H05K 5/03* (2006.01)
*G06F 1/16* (2006.01)
(Continued)

(52) U.S. Cl.
CPC ...... *G06F 1/1656* (2013.01); *A45C 2011/003* (2013.01); *H05K 5/0213* (2013.01); *H05K 5/03* (2013.01)

(58) Field of Classification Search
CPC .............. G06F 1/1656; H05K 7/20009; H05K 9/0007; H05K 9/0041; H05K 9/0043; H05K 9/005; H05K 5/0213; H05K 5/03
See application file for complete search history.

(56) References Cited

U.S. PATENT DOCUMENTS

| 2004/0083697 | A1* | 5/2004 | Niakin | B01D 39/083 |
| | | | | 55/486 |
| 2007/0175192 | A1* | 8/2007 | Niakan | B01D 46/521 |
| | | | | 55/486 |

(Continued)

FOREIGN PATENT DOCUMENTS

| CN | 203733183 U | 7/2014 |
| CN | 203775582 U | 8/2014 |

(Continued)

OTHER PUBLICATIONS

An Office Action for the corresponding TW Application No. TW10720852940; dated Sep. 14, 2018. 6 Pages.

(Continued)

*Primary Examiner* — Hoa C Nguyen
*Assistant Examiner* — Keith DePew
(74) *Attorney, Agent, or Firm* — Muncy, Geissler, Olds & Lowe, P.C.

(57) ABSTRACT

The present disclosure provides a housing assembly, and the housing assembly is applied to an electronic device. The housing assembly includes a first part and a second part. The first part includes at least one opening. The second part includes at least one mesh area. The mesh area deformably connects to the first part, and covers the opening.

9 Claims, 16 Drawing Sheets

(51) Int. Cl.
  *A45C 11/00* (2006.01)
  *H05K 5/02* (2006.01)

(56) References Cited

U.S. PATENT DOCUMENTS

| | | | |
|---|---|---|---|
| 2012/0291809 A1* | 11/2012 | Kuhe | A47L 5/24 |
| | | | 134/18 |
| 2015/0059042 A1* | 3/2015 | Aquino | F41H 1/02 |
| | | | 2/2.5 |
| 2016/0259514 A1 | 9/2016 | Sang et al. | |
| 2016/0363342 A1* | 12/2016 | Gutch | G01D 11/24 |
| 2017/0311394 A1* | 10/2017 | Shibuya | A47J 27/04 |
| 2018/0031311 A1* | 2/2018 | Hao | F25D 29/00 |

FOREIGN PATENT DOCUMENTS

| | | |
|---|---|---|
| CN | 204360296 U | 5/2015 |
| CN | 105549705 A | 5/2016 |
| CN | 105639811 A | 6/2016 |
| CN | 105889721 A | 8/2016 |
| CN | 105892973 A | 8/2016 |
| CN | 205864959 U | 1/2017 |
| TW | 200901906 A | 1/2009 |
| TW | M491451 U | 12/2014 |
| TW | M501712 U | 5/2015 |

OTHER PUBLICATIONS

Web Page posted Apr. 25, 2017; Vision X6, https://goods.ruten.com.tw/item/show?;21717003490431. Accesssed Sep. 17, 2018. 6 Pages.

* cited by examiner

HOUSING ASSEMBLY AND COVER APPLIED TO ELECTRONIC DEVICE

CROSS-REFERENCE TO RELATED APPLICATION

This application claims the priority to U.S. Provisional Patent Application No. 62/530,855, filed on Jul. 11, 2017, and China Patent Application No. 201810518535.6 filed on May 25, 2018. The entirety of the above-mentioned patent application is hereby incorporated by reference herein and made a part of specification.

BACKGROUND OF THE INVENTION

Field of the Invention

The present disclosure relates to a housing assembly and a cover, and in particular, to a housing assembly and a cover applied to an electronic device.

Related Art

In consideration of electromagnetic shielding and security, to design heat dissipation holes and select the material of an electronic device housing become significantly limited. For example, a metal housing of the electronic device is not suitable to form an excessively large opening on the housing. Therefore, appearance design of the electronic device is also limited.

BRIEF SUMMARY OF THE INVENTION

The present disclosure provides a housing assembly applied to an electronic device. In addition to the EMI effect, the housing assembly is further adjusted according to requirements of a user, to provide more usage modes.

The present disclosure provides a housing assembly that applied to an electronic device. The housing assembly includes a first part and a second part. The first part includes at least one opening. The second part includes at least one mesh area. The mesh area deformably connects to the first part, and covers the opening.

The present disclosure further provides a cover, and the cover is applied to an electronic device. The electronic device includes a housing, and the housing includes at least one opening. The cover includes a mesh area, and the mesh area deformably connects to the housing, and covers the opening.

A housing assembly of a conventional electronic device includes only EMI shielding effect and heat dissipation functions. In comparison, the housing assembly of the disclosure includes an air-permeable mesh structure as the second part. In addition to providing the EMI effect, the housing assembly further selectively deforms to form an opening, so as to improve a heat dissipation. The material of the mesh structure is a transparent material, a translucent material, a permeable material, a flexible material, a collapsible material, a conductive material, a waterproof material, a dust-proof material, or the like.

Specific embodiments adopted in the present disclosure are further described with reference to the following embodiments and accompanying drawings.

DETAILED DESCRIPTION

The following describes in detail specific implementations of the present disclosure with reference to the schematic diagrams. According to the following description and the scope of the application patent, the advantages and features of the present disclosure are clearer. It should be noted that all the illustrations adopt extremely simple forms and non-precise proportions that are merely used for conveniently and clearly describing objectives of the embodiments according to the present disclosure.

Figure 1A:
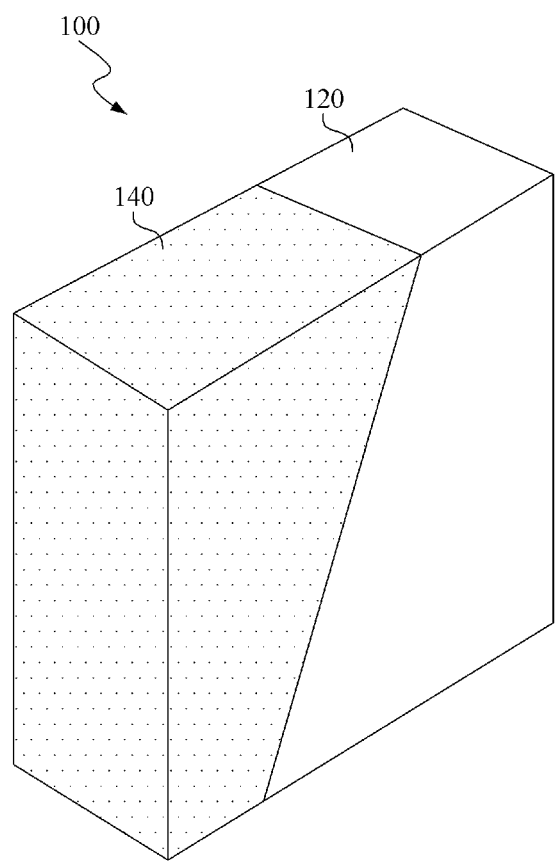
FIG. 1A and FIG. 1B are schematic diagrams of a housing assembly applied to an electronic device according to a first embodiment of the present disclosure.
Figure 1B:
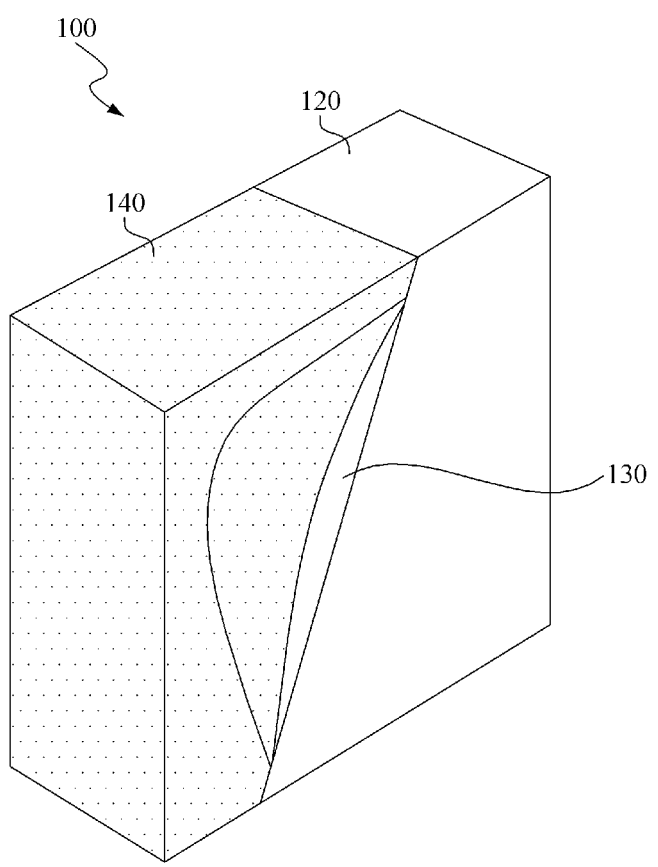

FIG. 1A and FIG. 1B are schematic diagrams of a housing assembly 100 applied to an electronic device according to a first embodiment of the present disclosure. In an embodiment, the electronic device herein is a desk top computer, a notebook computer, a tablet computer, a router, a mainboard, a graphics card, which is not limited herein. As shown in the figures, the housing assembly 100 includes a first part 120 and a second part 140. The first part 120 includes an opening toward the second part. The second part 140 connects to the first part 120 to cover the opening. The second part 140 is an air-permeable mesh cover that is used for heat dissipation of the electronic device. The air-permeable mesh cover is selectively deformed by pressing so as to form as an opening 130 as an air inlet hole between the first part 120 and the second part 140.

In this embodiment, the second part 140 is completely formed by an air-permeable mesh structure. However, the present disclosure is not limited herein. In an embodiment, the second part includes at least one air-permeable mesh area for heat dissipation of the electronic device, and is partly formed by the air-permeable mesh structure.

In an embodiment, the first part 120 removably connects to the second part 140. However, the present disclosure is not limited herein. Alternatively, the second part 140 is fixed to the first part 120.

In an embodiment, as shown in FIG. 1A, when a user operates the electronic device in a low power-consumed operation mode such as document processing or website browsing, the opening 130 is not formed between the second part 120 and the first part 140. In this case, heat inside the electronic device is dissipated out through the second part 140. As shown in FIG. 1B, in an overclocking mode requiring a relatively good heat dissipation effect, the second part 140 is pressed to concave inward and deform, to form the opening 130. The opening 130 is used for inletting air to improve heat dissipation efficiency, and the opening 130 is located between the first part 120 and the second part 140. A deformation degree and form of the second part 140 (that is a mesh mask) are adjusted depending on requirements, to provide required heat dissipation efficiency.

Figure 2:
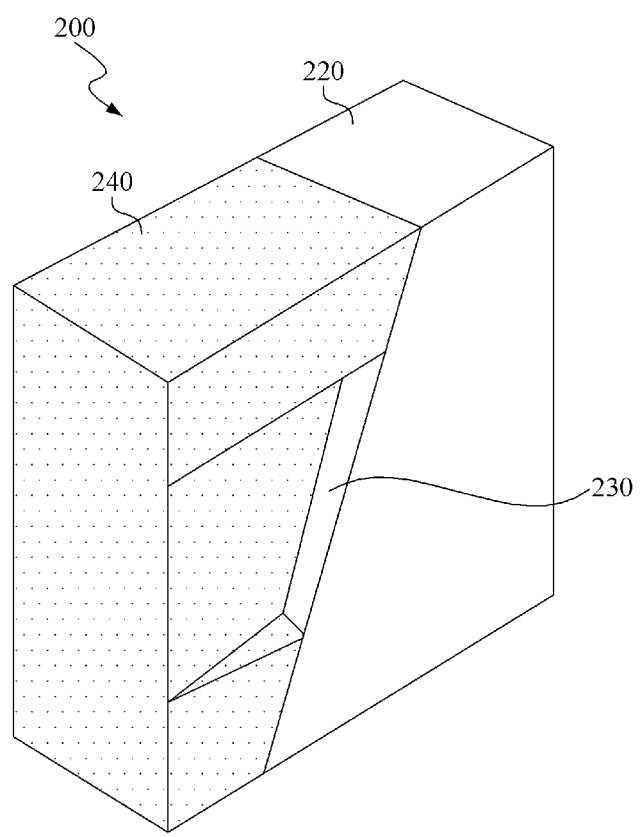
FIG. 2 is a schematic diagram of a housing assembly applied to an electronic device according to a second embodiment of the present disclosure.

FIG. 2 is a schematic diagram of a housing assembly 200 applied to an electronic device according to a second embodiment of the present disclosure. The housing assembly includes a first part 220 and a second part 240. The design of the mesh structure of the second part 240 according to this embodiment is different from that of the first embodiment. Therefore, an opening 230 formed by pressing the second part 240 according to this embodiment is different from that in the embodiment in FIG. 1B.

Figure 3A:
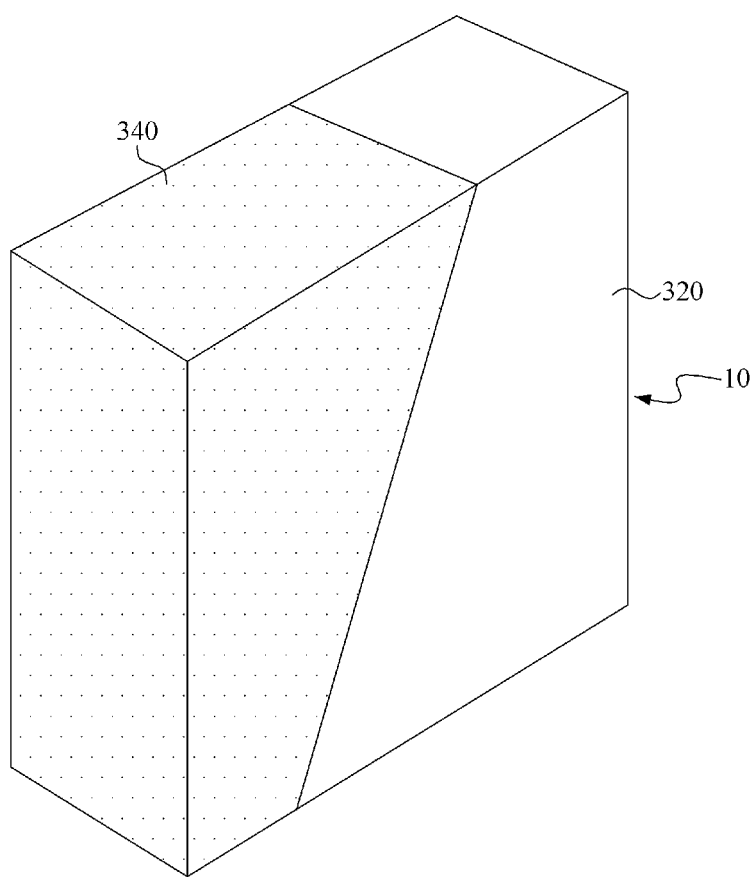
FIG. 3A to FIG. 3D are schematic diagrams of a housing assembly applied to an electronic device according to a third embodiment of the present disclosure.
Figure 3B:
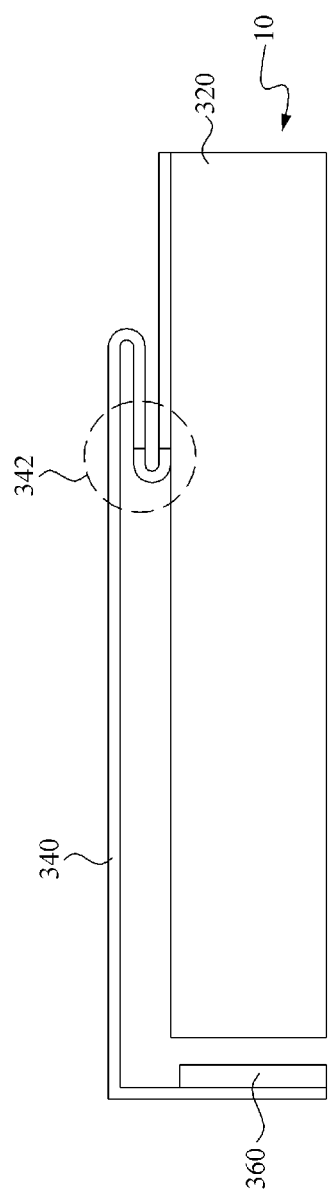
Figure 3C:
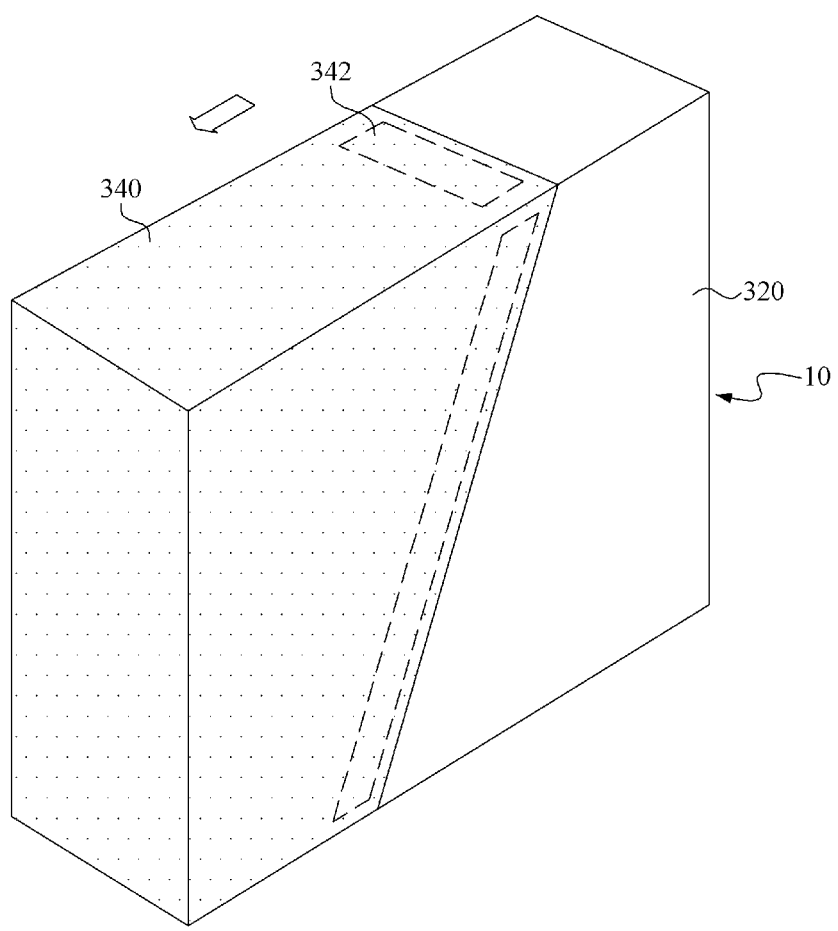
Figure 3D:
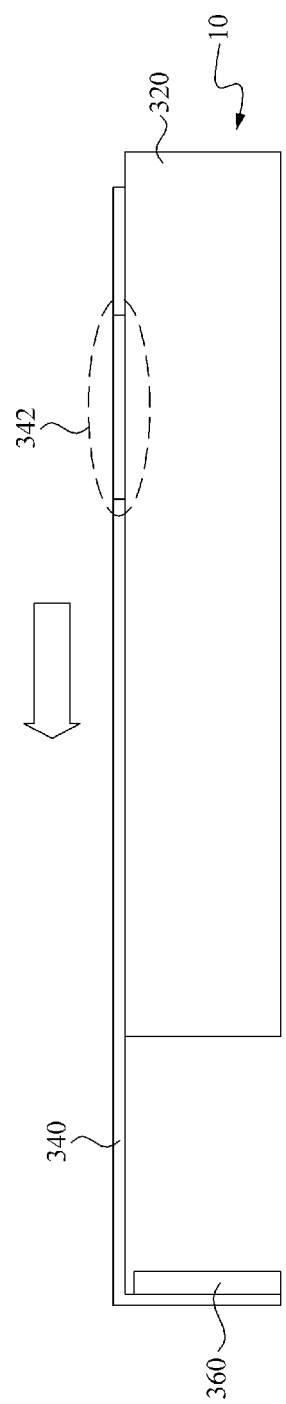

FIG. 3A to FIG. 3D are schematic diagrams of a housing assembly applied to an electronic device according to a third embodiment of the present disclosure. FIG. 3B is a schematic top view corresponding to FIG. 3A. FIG. 3D is a schematic top view corresponding to FIG. 3C. As shown in the figures, the housing assembly includes a first part and a second part. The first part is a main housing 320 of the electronic device 10, and the second part is a cover 340. The cover 340 is formed by a mesh structure, and is sleeved on the main housing 320 of the electronic device 10. The cover 340 includes an air inlet area 342 located thereon adjacent to the main housing 320 of the electronic device 10. The cover 340 further connects to the main housing 320 of the electronic device 10 in diverse connection modes, to meet user requirements.

In an embodiment, the cover 340 includes at least one sensing element 360. The sensing element 360 is disposed on different locations of the cover. In an embodiment, as shown in FIG. 3A and FIG. 3B, in a normal operation mode such as document processing or website browsing, the end of the cover 340 tightly leans against the main housing 320 of the electronic device 10, and the air inlet area 342 of the cover 340 is in a folded status. As shown in FIG. 3C and FIG. 3D, when the cover 340 moves outward, the air inlet area 342 of the cover 340 unfolds to allow air to flow into the electronic device. At the same time, the sensing element 360 is triggered to send a signal to the electronic device 10. The electronic device 10 switches to an overclocking mode while the signal is received. In an embodiment, the signal is used for triggering the electronic device 10 to execute various settings such as heat dissipation settings.

Figure 4:
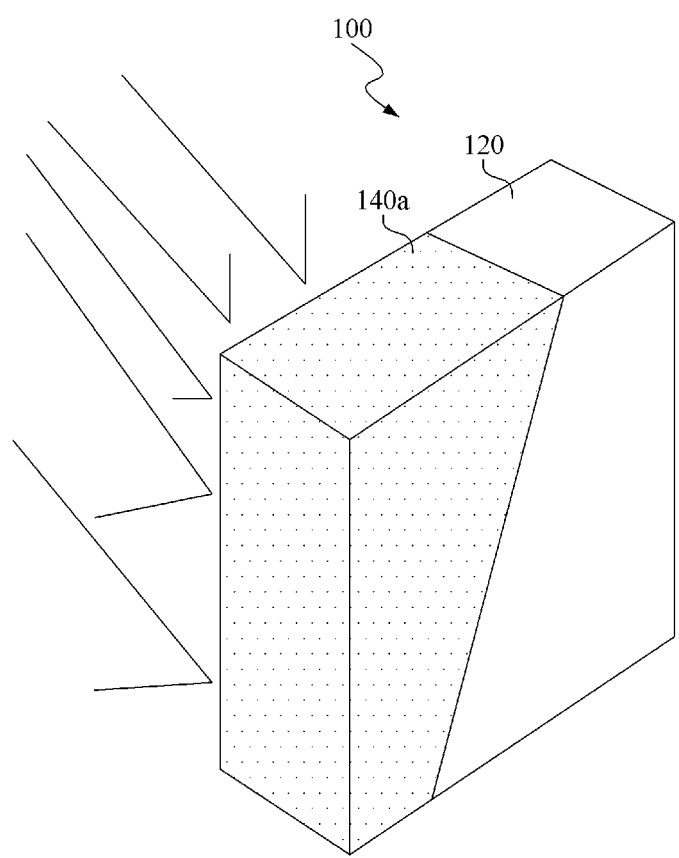
FIG. 4 is a schematic diagram of the material of a second part of a housing assembly according to a first embodiment of the present disclosure.

FIG. 4 is a schematic diagram of the material of a second part of a housing assembly according to a first embodiment of the present disclosure. As shown in the figure, the material of a mesh area of a second part 140a includes an EMI reducing material, for example, a metal material, to provide EMI for the electronic device.

Figure 5:
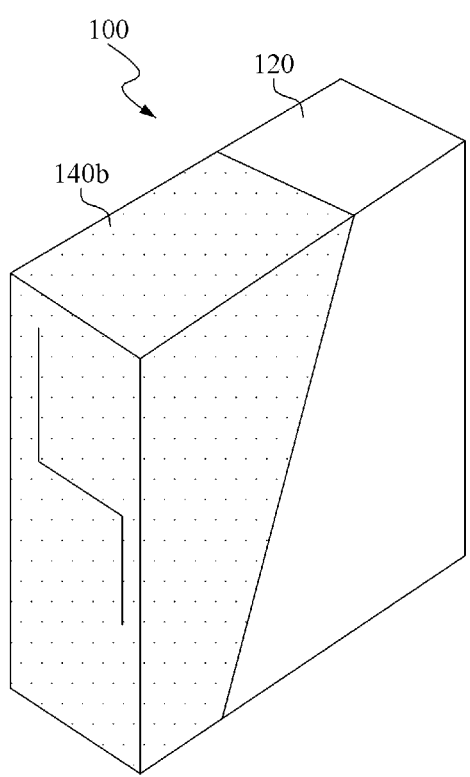
FIG. 5 is a schematic diagram of the material of a second part of a housing assembly according to a second embodiment of the present disclosure.

FIG. 5 is a schematic diagram of the material of a second part of a housing assembly according to a second embodiment of the present disclosure. As shown in the figure, in an embodiment, the material of a mesh area of a second part 140b include a transparent material or a translucent material. The electronic device presents or displays information through the mesh area. In an embodiment, the material of the second part 140b includes a light diffusion material. The electronic device provide an indicate function with a light source through the mesh structure.

Figure 6:
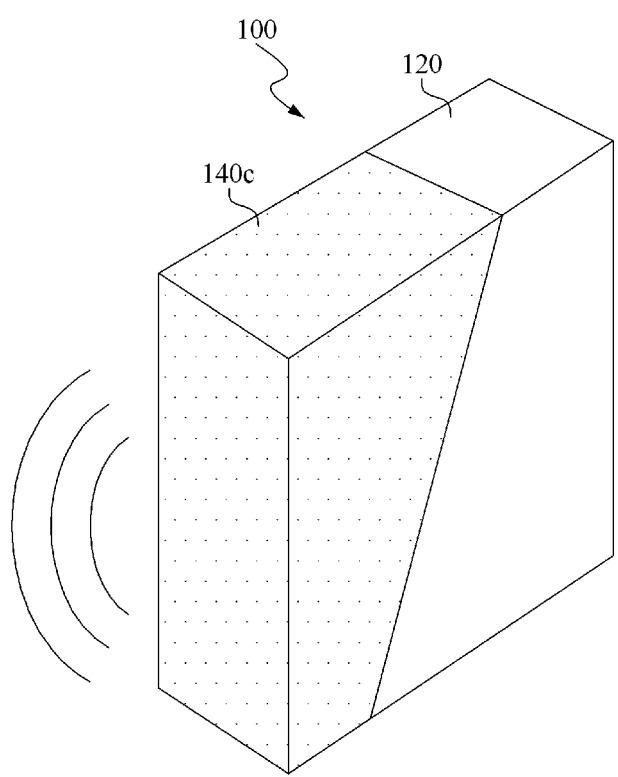
FIG. 6 is a schematic diagram of the material of a second part of a housing assembly according to a third embodiment of the present disclosure.

FIG. 6 is a schematic diagram of the material of a second part of a housing assembly according to a third embodiment of the present disclosure. As shown in the figure, in an embodiment, the material of a mesh area of a second part 140c includes a permeable material such as textile fabrics. And the electronic device is able to communicate with other electronic device through the mesh area.

Figure 7:
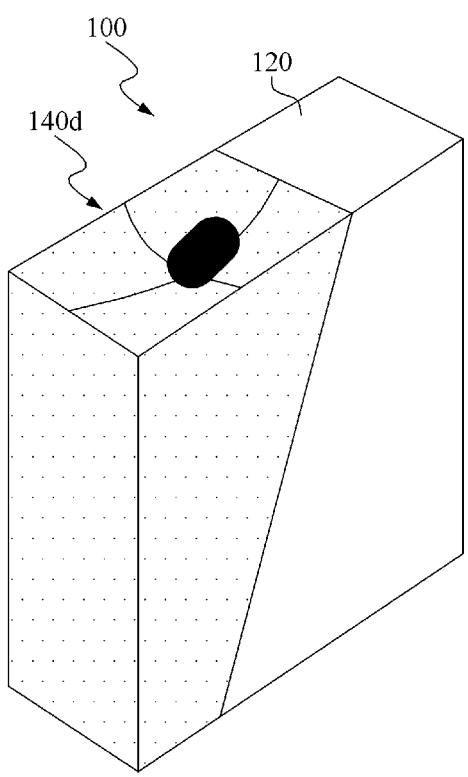
FIG. 7 is a schematic diagram of the material of a second part of a housing assembly according to a fourth embodiment of the present disclosure.

FIG. 7 is a schematic diagram of the material of a second part of a housing assembly according to a fourth embodiment of the present disclosure. In an embodiment, as shown in the figure, the material of a mesh area of a second part 140d includes a flexible material such as a rubber material. And the mesh area is configured for placing an object on.

Figure 8:
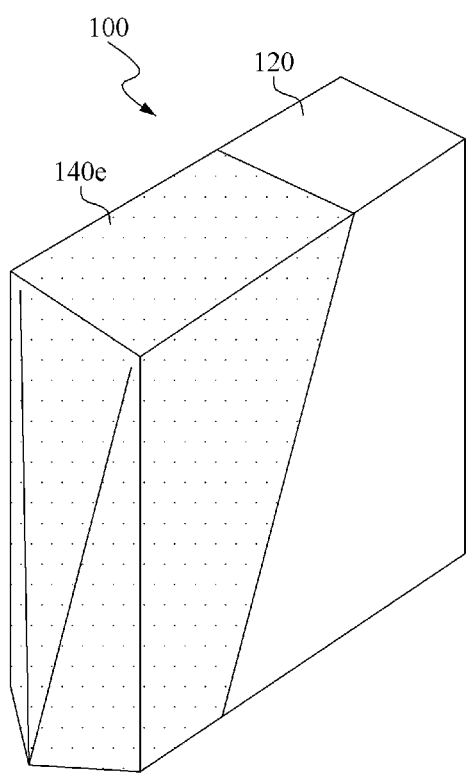
FIG. 8 is a schematic diagram of the material of a second part of a housing assembly according to a fifth embodiment of the present disclosure.

FIG. 8 is a schematic diagram of the material of a second part of a housing assembly according to a fifth embodiment of the present disclosure. In an embodiment, as shown in the figure, the material of the second part 140e includes a collapsible material. The second part 140e adjusts the inner space thereof through being collapsed.

Figure 9A:
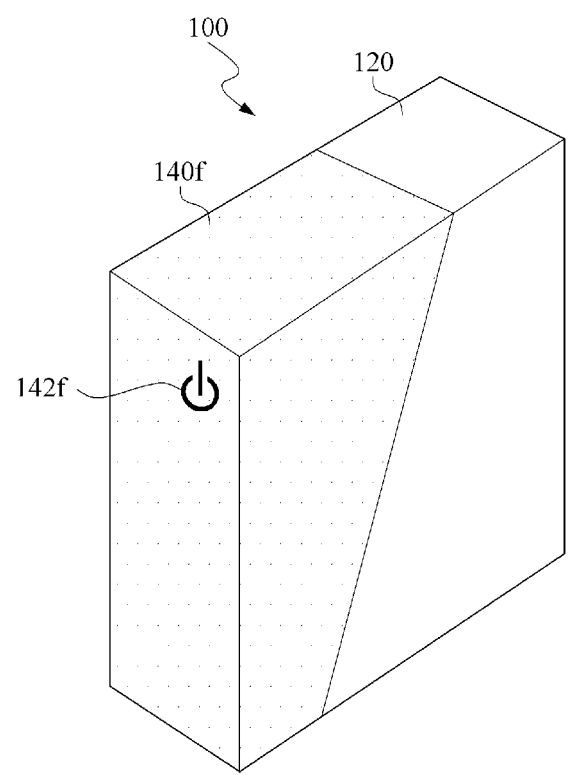
FIG. 9A and FIG. 9B are schematic diagrams of the material of a second part of a housing assembly according to a sixth embodiment of the present disclosure.
Figure 9B:
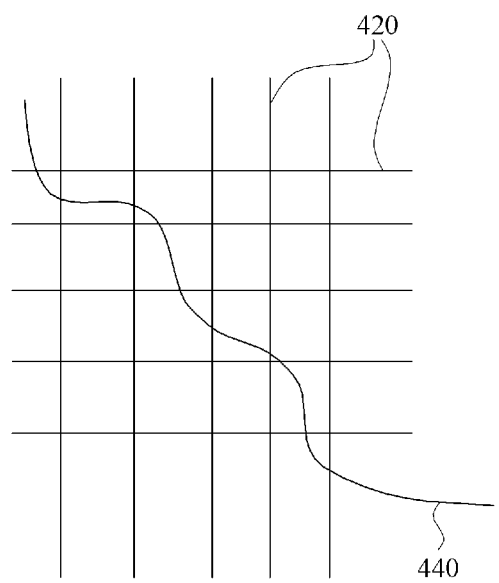

FIG. 9A and FIG. 9B are schematic diagrams of the material of a second part of a housing assembly according to a sixth embodiment of the present disclosure. In an embodiment, as shown in the figure, the material of a mesh area of the second part 140f includes a conductive material. The electronic device integrates a part of electronic elements into a mesh area, such as a power switch 142f In an embodiment, as shown in FIG. 9B, metal wires 440 such as ground wires are woven as a mesh structure 420 with textile fabrics, to form the conductive material.

Figure 10:
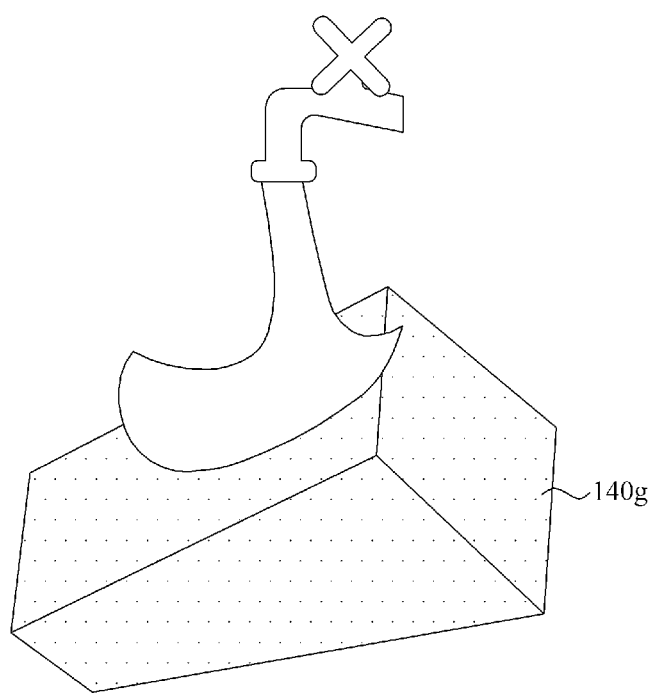
FIG. 10 is a schematic diagram of the material of a second part of a housing assembly according to a seventh embodiment of the present disclosure.

FIG. 10 is a schematic diagram of the material of a second part of a housing assembly according to a seventh embodiment of the present disclosure. In an embodiment, as shown in the figure, the material of a mesh area of a second part 140g includes a waterproof material such as a plastic material.

Figure 11:
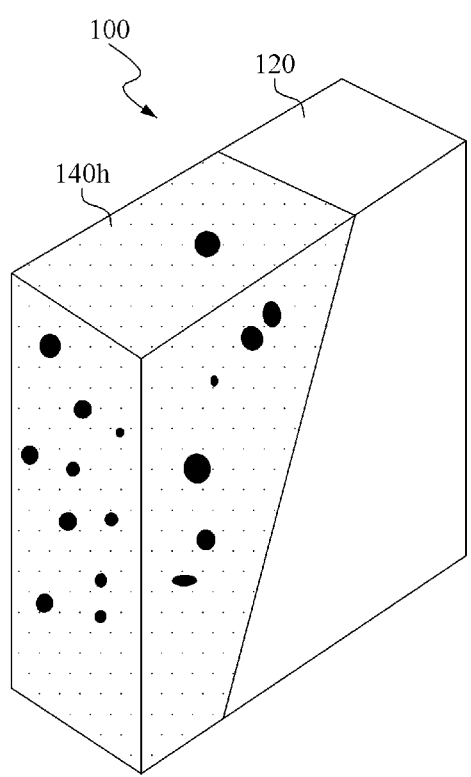
FIG. 11 is a schematic diagram of the material of a second part of a housing assembly according to an eighth embodiment of the present disclosure.

FIG. 11 is a schematic diagram of the material of a second part of a housing assembly according to an eighth embodiment of the present disclosure. In an embodiment, as shown in the figure, the material of a mesh area of a second part 140h includes a dust-proof material, to prevent dust accumulation.

The housing assembly according to the disclosure includes the second part formed by an air-permeable mesh structure. In addition to providing the EMI shielding effect, the housing assembly further selectively deforms to form an opening to improve heat dissipation. The mesh structure is further made of a transparent material, a translucent material, a permeable material, a flexible material, a collapsible material, a conductive material, a waterproof material, a dust-proof material, or the like, to provide diverse usage modes.

Although the present disclosure has been disclosed above through the embodiments, the embodiments are not intended to limit the present disclosure. A person of ordinary skill in any technical field can make some changes or polishing without departing from the spirit and scope of the present disclosure. Therefore, the protection scope of the present disclosure shall be subject to the claims.

What is claimed is:

1. A housing assembly, applied to an electronic device, and the housing assembly comprising:

a first part, including an opening; and a second part, including a mesh area deformably connecting to the first part and covering the opening, wherein the mesh area is configured to be selectively deformed to form an air inlet area, and wherein the second part is sleeved on the first part.

2. The housing assembly according to claim 1, further comprising a sensing element, configured to detect a connection mode between the second part and the first part.

3. The housing assembly according to claim 1, wherein the air inlet area is adjacent to the first part.

4. The housing assembly according to claim 3, wherein the air inlet area comprises an air inlet hole, and the air inlet hole is located between the first part and the mesh area.

5. The housing assembly according to claim 1, wherein the material of the mesh area comprises a textile material mixed with metal wires.

6. A cover, applied to an electronic device, the electronic device including a housing with an opening, and the cover comprising:

a mesh area, deformably connecting to the housing, and covering the opening, wherein the mesh area is configured to be selectively deformed to form an air inlet area, and wherein the cover is configured to be sleeved on the housing.

7. The cover according to claim 6, further comprising a sensing element, configured to detect a connection mode between the cover and the housing.

8. The cover according to claim 6, wherein the air inlet area comprises an air inlet hole.

9. The cover according to claim 6, wherein the material of the mesh area comprises a textile fabric woven with metal wires.

* * * * *